US005767012A

United States Patent [19]
Fulford, Jr. et al.

[11] Patent Number: 5,767,012
[45] Date of Patent: Jun. 16, 1998

[54] METHOD OF FORMING A RECESSED INTERCONNECT STRUCTURE

[75] Inventors: H. Jim Fulford, Jr.; Basab Bandyopadhyay; Robert Dawson; Fred N. Hause, all of Austin; Mark W. Michael, Cedar Park; William S. Brennan, Austin, all of Tex.

[73] Assignee: Advanced Micro Devices, Inc., Sunnyvale, Calif.

[21] Appl. No.: 660,674

[22] Filed: Jun. 5, 1996

[51] Int. Cl.$^6$ .................. H01L 21/283; H01L 21/302
[52] U.S. Cl. .................. 438/622; 438/629; 438/631; 438/637; 438/672
[58] Field of Search .................. 437/189, 192, 437/195, 415 M, 187, 228; 257/752, 758, 760, 763; 438/622, 629, 631, 633, 637, 672

[56] References Cited

U.S. PATENT DOCUMENTS

| | | | |
|---|---|---|---|
| 3,974,517 | 8/1976 | Sanders et al. | 357/48 |
| 5,141,896 | 8/1992 | Katoh | 437/195 |
| 5,187,121 | 2/1993 | Cote et al. | 437/195 |
| 5,189,506 | 2/1993 | Cronin et al. | 257/752 |
| 5,382,545 | 1/1995 | Hong | 437/195 |
| 5,466,636 | 11/1995 | Coonin et al. | 437/187 |

FOREIGN PATENT DOCUMENTS

| | | | |
|---|---|---|---|
| 5-198691 | 6/1993 | Japan | 257/758 |

OTHER PUBLICATIONS

Wolf, S., Silicon Processing for the VLSI Era, 1990, Lattice Press, vol. 2, pp. 189–206, 279–285, 1990.
IBM Technical Disclosure Bulletin entitled "Sub–Surface Local Interconnects," vol. 34, No. 12, May 1, 1992, pp. 283–285.

International Search Report for PCT/US 97/02509 dated Jul. 1, 1997.

Primary Examiner—T. N. Quach
Attorney, Agent, or Firm—Kevin L. Daffer; Conley, Rose & Tayon

[57] ABSTRACT

A method of forming a recessed interconnect structure is provided. The interconnect structure includes several levels of conductors, wherein conductors on one level are staggered with respect to conductors on another level. In densely spaced interconnect areas, interposed conductors are drawn to dissimilar elevational levels to lessen the capacitive coupling between the interconnects. By staggering every other interconnect line in the densely patterned areas, the interconnects are capable of carrying a larger amount of current with minimal capacitive coupling therebetween. The method of forming a recessed interconnect structure comprises forming a substantially coplanar set of the first conductors upon a semiconductor substrate, depositing a first dielectric layer on said first conductors, forming a trench in the first dielectric layer, depositing a conductive material in the trench, planarizing the conductive material an upper surface of the conductive material is substantially coplanar with an upper surface of the first dielectric, etching the conductive material until the upper surface of the conductive material is displaced below the upper surface of the first dielectric, forming a second dielectric on the conductive material and the first dielectric layer.

10 Claims, 5 Drawing Sheets

METHOD OF FORMING A RECESSED INTERCONNECT STRUCTURE

BACKGROUND OF THE INVENTION

1. Field of the Invention

This invention relates to semiconductor fabrication and more particularly to a method and structure for reducing intralevel capacitive coupling between adjacent conductors in areas of dense circuitry by staggering an intermediate conductor with respect to its adjacent conductors.

2. Description of the Relevant Art

An integrated circuit includes numerous conductors extending across the topography of a monolithic substrate. A set of interconnect lines (or conductors) which serve to electrically connect two or more components within a system is generally referred to as a "bus". A collection of voltage levels are forwarded across the conductors to allow proper operation of the components. For example, a microprocessor is connected to memories and input/output devices by certain bus structures. There are numerous types of busses which are classified according to their operation. Examples of well-known types of busses include address busses, data busses and control busses.

Conductors within a bus generally extend parallel to each other across the semiconductor topography. The conductors are isolated from each other and from underlying conductive elements by a dielectric, a suitable dielectric being, for example, silicon dioxide ("oxide"). Conductors are thereby lithography patterned across the semiconductor topography, wherein the topography comprises a substrate with a dielectric placed thereon. The topography can also include one or more layers of conductors which are sealed by an upper layer of dielectric material. Accordingly, the layers of conductors overlaid with a dielectric present a topography upon which a subsequent layer of conductors can be patterned.

Conductors are made from an electrically conductive material, a suitable material includes Cu, Al, Ti, Ta, W, Mo, polysilicon, or a combination thereof. Substrate includes any type of material which can retain dopant ions and the isolated conductivity regions brought about by those ions. Typically, substrate is a silicon-based material which receives p-type or n-type ions.

Generally speaking, interconnect lines (or conductors) are fashioned upon the topography and spaced above an underlying conductor or substrate by a dielectric of thickness $T_{d1}$. Each conductor is dielectrically spaced from other conductors within the same level of conductors by a distance $T_{d2}$. Accordingly, interlevel capacitance $C_{LS}$ (i.e., capacitance between conductors on different levels) is determined as follows:

$$C_{LS} = \epsilon W_L L / T_{d1} \qquad \text{(Eq. 1)}$$

Further, the intralevel capacitance $C_{LL}$ (i.e., capacitance between conductors on the same level) is determined as follows:

$$C_{LL} = \epsilon T_c L / T_{d2} \qquad \text{(Eq. 2)}$$

where $\epsilon$ is the permittivity of the dielectric material (the dielectric material between the conductor and substrate or the dielectric material between conductors), $W_L$ is the conductor width, $T_c$ is the conductor thickness, and L is the conductor length. Resistance of the conductor is calculated as follows:

$$R = (\rho L) / W_L T_c \qquad \text{(Eq. 3)}$$

where $\rho$ represents resistivity of the conductive material, and $T_c$ is the interconnect thickness. Combinations of equations 1 and 3, and/or equations 2 and 3 indicate the propagation delay of a conductor as follows:

$$RC_{LS} = \rho \epsilon L^2 / T_c T_{d1}, \quad RC_{LL} = \rho \epsilon L^2 / W_L T_{d2} \qquad \text{(Eq. 4)}$$

Propagation delay is an important characteristic of an integrated circuit since it limits the speed (frequency) at which the circuit or circuits can operate. The shorter the propagation delay, the higher the speed of the circuit or circuits. It is therefore important that propagation delay be minimized as much as possible within the geometric constraints of the semiconductor topography.

Equation 4 shows that the propagation delay of a circuit is determined by parasitic capacitance values ($C_{LL}$) between laterally spaced conductors, and parasitic capacitance values ($C_{LS}$) between vertically spaced conductors or between a conductor and the underlying substrate. As circuit density increases, lateral spacing and vertical spacing between conductors decrease and capacitance $C_{LL}$ increases. Meanwhile, planarization mandates to some extent a decrease in vertical spacing. Shallow trench processing, recessed LOCOS processing, and multi-layered interlevel dielectrics bring about an overall reduction in vertical spacing and therefore an increase in $C_{LS}$. Integrated circuits which employ narrow interconnect spacings thereby define $C_{LL}$ as a predominant capacitance, and integrated circuits which employ thin interlevel dielectrics define $C_{LS}$ as a predominant capacitance.

Increases in $C_{LL}$ or $C_{LS}$ parasitic capacitance pose two major problems. First, an increase in parasitic capacitance generally causes an increase in the time at which a transition on the one end of the conductor occurs at the other end. Increased transition time slows circuit operation because a longer drive period is required to allow the entire conductor to achieve a steady state value. If the conductor extends along a critical speed path, speed degradation on the line will jeopardize functionality of the overall circuit. Second, a larger parasitic capacitance causes an increase in crosstalk noise. A conductor which does not transition, nonetheless receives crosstalk noise from neighboring lines which do.

Figure 1:
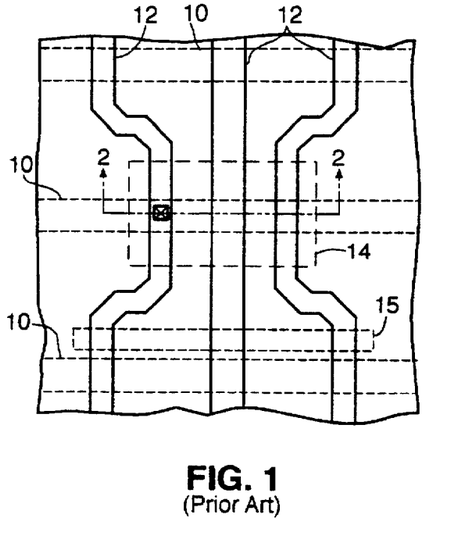
FIG. 1 is a partial top plan view of a conventional dual level interconnect structure.
Figure 2:
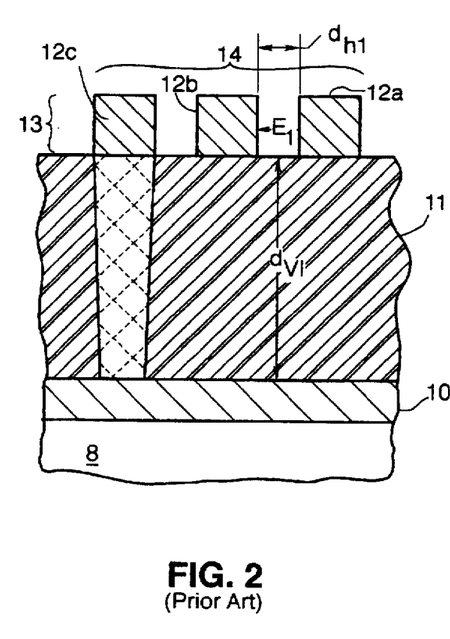
FIG. 2 is a partial cross-sectional view taken along the view indicated in FIG. 1.

It is therefore important to minimize propagation delay especially in critical speed paths. FIGS. 1 and 2 show a partial top plan view and a partial cross-sectional view, respectively, of a conventional dual level interconnect structure. A plurality of first conductors 10 is arranged across semiconductor substrate 8 to form a first interconnect level. Substrate 8 is defined to include a dielectric, upon which interconnect is patterned and selectively linked, possibly through openings within the dielectric. Subsequent to formation of an interconnect, dielectric layer 11 is formed upon first interconnect level 10. A plurality of second conductors 12 is then arranged upon first dielectric layer 11 to form second interconnect level 13. Regions 14 of dense circuitry occur in second interconnect level 13 wherever a plurality of second conductors 12 come in close proximity to each other. As seen more clearly in FIG. 2, the horizontal displacement between adjacent second conductors 12, shown as $d_{h1}$, can be significantly greater than the vertical displacement, $d_{v1}$, between first interconnect level 10 and second interconnect level 13. When $d_{h1}$ is significantly less than $d_{v1}$, intralevel capacitance $C_{LL}$ tends to dominate circuit performance. Stated similarly, control and minimization of intralevel capacitance $C_{LL}$ becomes increasingly significant as the horizontal displacement between adjacent conductors decreases. Given the constraints of chemical compositions, it is not readily plausible to reduce the resistivity $\rho$ of conductor materials nor the permittivity $\epsilon$ of conventional interlevel dielectrics such as CVD (chemical vapor deposition) oxides. Processing constraints make it difficult to increase conductor thickness $T_c$ or dielectric thickness $T_{d1}$ or $T_{d2}$. Still further, instead of reducing length L of a conductor, most modern integrated circuits employ long interconnect lines which compound the propagation delay problems. Accordingly, a need arises for instituting a reduction in propagation delay and cross talk noise within the constraints of existing fabrication processes.

SUMMARY OF THE INVENTION

The problems outlined above are in large part solved by an improved multilevel interconnect structure. The interconnect structure includes staggered interconnect lines formed in areas where interconnect lines are densely spaced. The staggered interconnect lines are formed by routing an intermediate conductor (i.e. a conductor arranged laterally between two adjacent conductors in a densely space region) to a local conductor level formed in a plane that is vertically displaced below the plane of the adjacent conductors. According to one exemplary embodiment, the multilevel interconnect structure comprises two levels of global interconnects, typically comprised of copper or aluminum, and a local interconnect level preferably comprised of tungsten or other refractory metal. The first global interconnect level includes a plurality of a substantially coplanar first conductors arranged on a semiconductor substrate. After a first dielectric layer is formed on the first interconnect level, a trench is formed in the first dielectric layer preferably with an anisotropic dry etch process. The trench extends downward from an upper surface of the first dielectric layer partially through the first dielectric layer.

The local conductor level is formed preferably by blanket depositing a conductive material such as tungsten onto the wafer to fill the trench. Excess conductive material is then removed from the wafer preferably with a chemical mechanical polish process designed to terminate when the upper surface of the conductive material is substantially coplanar with the upper surface of the first dielectric layer. Next, an etch process that is selective to the conductive material is performed to etch away portions of the conductive material proximal to the upper surface of the first dielectric layer. The conductive material remaining after the etch process forms a recessed conductor that has an upper surface vertically displaced below the upper surface of the first dielectric layer. A second dielectric layer is then formed to fill the trench and seal the local conductor. The second dielectric can then be planarized back to the upper surface of the first dielectric. A second interconnect level is next formed and patterned onto the first dielectric layer. The second interconnect level comprises a plurality of dielectrically spaced, substantially coplanar second conductors.

Local conductors are arranged in a staggered configuration with respect to the second level conductors. Staggering the conductors on dissimilar elevational levels serves to increase the spacing between densely patterned second and local conductors. More particularly, direct electrical field between operating second and local conductors is minimized. Current within conductors is typically distributed throughout the cross-sectional area of the conductor. Sinking the local conductor between a pair of second level conductors affords minimal direct electric field therebetween. The cross-coupling between the local conductor and the pair of second conductors is thereby reduced. The improved multilevel interconnect structure thereby allows formation of a dense interconnect structure but within two separate planes instead of one. Placing interconnect lines on separate planes thereby reduces propagation delay of signals sent through the lines. Broadly speaking, the present invention contemplates a method of forming a recessed interconnect structure. A first interconnect level is formed upon a semiconductor substrate and a first dielectric layer is formed on the first interconnect level. The first interconnect level is preferably comprised of copper or aluminum while the first dielectric layer is preferably an oxide formed in a chemical vapor deposition chamber with a TEOS source. A trench is then formed in the first dielectric layer preferably through the use of an anisotropic dry etch. A conductive material such as a refractory metal is deposited in the trench. The conductive material is then planarized until an upper surface of the material is substantially coplanar with an upper surface of the first dielectric. The conductive material is then etched with a process selective to the conductive material to produce a recessed local conductor having an upper surface that is vertically displaced from the upper surface of the first dielectric layer. After the local interconnect has been formed, a second dielectric layer is formed, preferably in a CVD chamber, on the upper surface of the conductive material. In one embodiment of the invention, a contact tunnel extending from the upper surface of the second dielectric to the conductive material is formed. In another embodiment of the present invention, a contact opening extending from the upper surface of the second dielectric to the first interconnect level is formed. In one embodiment, the present invention still further contemplates forming a second interconnect level on the upper surface of the first dielectric.

The present invention still further contemplates a multilevel interconnect structure having a first interconnect level arranged on a semiconductor substrate. A first dielectric layer is arranged upon the first interconnect level. The first dielectric layer has a trench extending downward from the upper surface of the first dielectric. The trench contains a local connector comprising a conductive material having an upper surface vertically displaced below the upper surface of the first dielectric layer. A second dielectric layer is arranged on the local connector. First and second conductors of the second interconnect level are formed on the first dielectric layer. The first and second conductors have a lower surface which is vertically displaced above an upper surface of the local conductor. First and second conductors are horizontally displaced from either side of the local conductor by a horizontal distance. In one embodiment, the interconnect structure has one or more contact tunnels extending from one or more of the pair of second interconnects through the first dielectric layer to the first interconnect level. In another embodiment, the first dielectric layer has one or more contact tunnels extending from a third conductor of the second interconnect level through the first dielectric layer to local interconnect material.

The present invention still further contemplates an improvement to a semiconductor device comprising a first interconnect level, a first dielectric layer formed on the first interconnect level, and a second interconnect level arranged on the first dielectric layer. The improvement comprises replacing an intermediate conductor of the second interconnect level with a local conductor arranged within the first dielectric layer such that the upper surface of the local conductor is vertically displaced below the lower surface of the first and second conductors in the dense regions of the circuit.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 3:
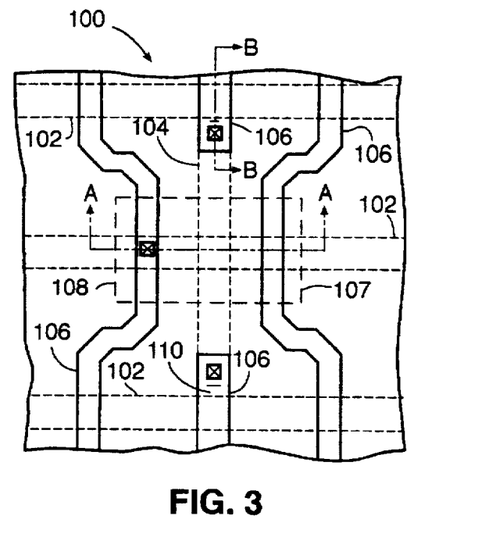
FIG. 3 is a partial top plan view of an improved multilevel interconnect structure.
Figure 4:
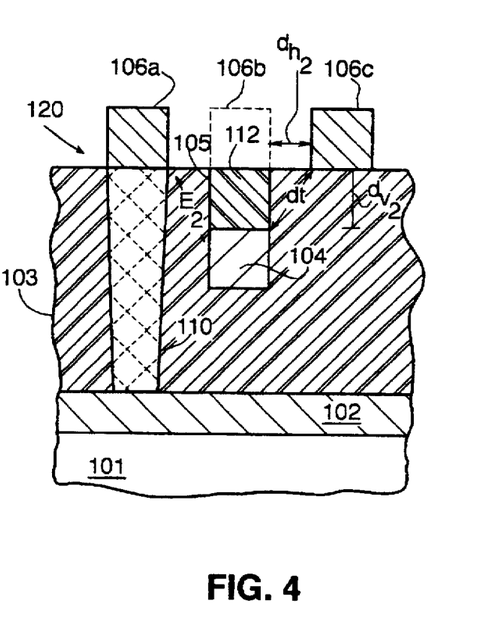
FIG. 4 is a partial cross-sectional view taken along view A of FIG. 3.
Figure 5A:
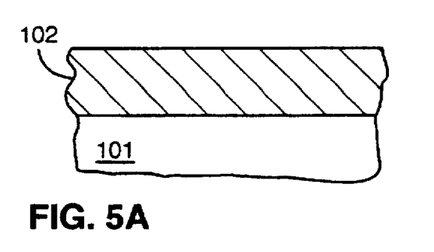
FIGS. 5A and 5B show partial cross-sectional views of a first interconnect level formed upon a semiconductor substrate taken along view A of FIG. 3 and view B of FIG. 3 respectively.
Figure 5B:
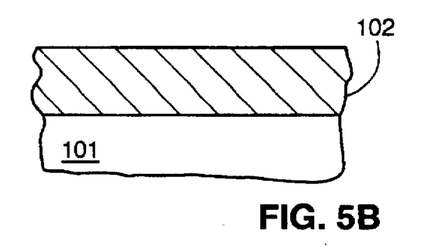
Figure 6A:
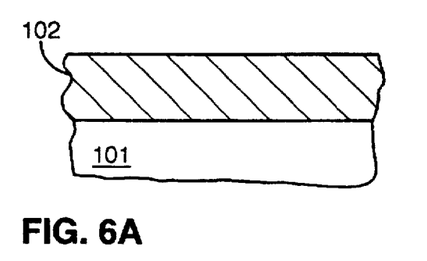
FIGS. 6A and 6B show a subsequent processing step in which the first interconnect level has been patterned and etched.
Figure 6B:
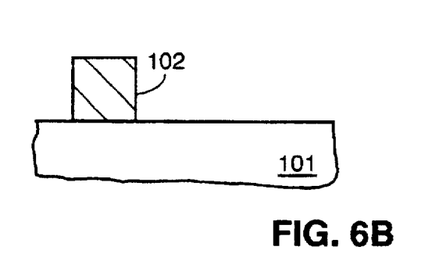
Figure 7A:
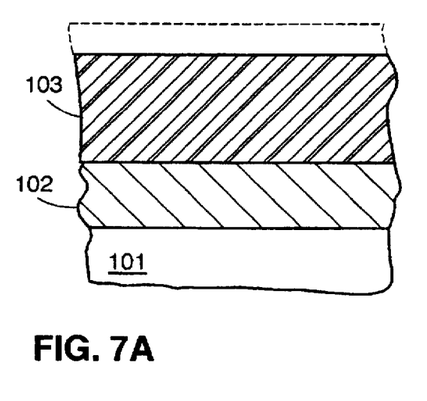
FIGS. 7A and 7B show a subsequent processing step in which a dielectric layer has been formed on the first interconnect level.
Figure 7B:
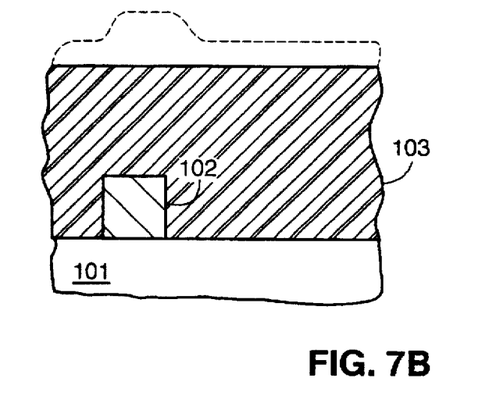

Turning now to FIG. 3, a top plan view of a multilevel interconnect structure 100 is shown. Interconnect structure 100 includes a plurality of interconnect conductors lithography formed on dissimilar elevational levels. Interconnect conductors formed on the same elevational level are spaced from each other a minimum distance defined by the layout rules associated with the manufacturer's process. In the embodiment shown in FIG. 3, three levels of interconnect are shown. A first interconnect level includes a plurality of substantially coplanar spaced set of first conductors 102. A local interconnect level includes a plurality of substantially coplanar set of local conductors 104 (only one of which is shown in the figure). The third level includes a plurality of substantially coplanar set of second conductors 106. For sake of brevity, FIG. 3 illustrates only three of the plurality of first conductors 102, only one of the plurality of local conductors 104, and only two of the plurality of second conductors 106. First conductors 102 are shown as having dotted lines, local conductor 104 is shown as having dashed lines, and second conductor 106 is shown as having solid lines. FIG. 4 is a cross-section taken along view A of FIG. 3. More specifically, FIG. 4 illustrates one exemplary layout attributed to numerous possible configurations of interconnect structure 100. FIG. 4 depicts the various elevational levels of first, local, and second conductors 102, 104, and 106, respectively. According to the exemplary embodiment shown, local conductor 104 is placed on an elevational level between first conductors 102 and second conductors 106. It is understood however that according to an alternative embodiment, second conductors 106 can be placed in an elevational level below local conductor 104.

FIG. 4 illustrates an interlevel dielectric structure 120 formed upon semiconductor substrate 101. Dielectric structure 120 comprises, according to one embodiment, a first interconnect level 102 arranged upon semiconductor substrate 101. First dielectric layer 103 is formed upon first interconnect level 102. First dielectric 103 includes trench 105 partially filled with conductive material 104. A second dielectric layer 112 is formed on conductive material 104. Second interconnects 106 are formed upon first dielectric 103. First and second conductors 106a and 106b of second interconnect level 106 are vertically displaced from the upper surface of local conductor 104 by a vertical distance $d_{v2}$. First and second conductors 106a and 106c are laterally displaced from either side of the conductive material by a horizontal distance $d_{h2}$. Applying the pythagorean theorem, it is seen that local conductor 104 is displaced from first and second conductors 106a and 106c by a distance $d_t$ approximately equal to $(d_{h2}^2+d_{v2}^2)^{1/2}$. A comparison of FIG. 2 and FIG. 4 reveals the advantages of vertically displacing local conductor 104 from the pair of second interconnect conductors 106. Electric field $E_1$ shown in FIG. 2 and $E_2$ shown in FIG. 4 arise because of a potential difference between adjacent conductors 12b and 12a. It is believed that electric field flux $\Phi_1$ is more significant in high density region 14 of FIG. 1 than flux $\Phi_2$ is in region 107 of FIG. 3. An electric field equivalent to $E_1$ of FIG. 2 would exist between second interconnect conductor 106c and conductor 106b of FIG. 4 if conductor 106b were formed on the same elevational plane as conductor 106c. In accordance with the present invention however, conductor 106b is replaced by local conductor 104 which is displaced from the elevational plane of second conductors 106a and 106c in regions of dense circuitry 107. It is believed that by raising or recessing local conductor 104 relative to second conductors 106a and 106c, electric field flux and capacitive coupling will be reduced between the local conductor 104 and second conductors 106a and 106c.

Turning now to FIGS. 5–16, a process sequence for forming a multilevel interconnect structure in accordance with the present invention is shown. Each of the figures contains an "A" side and a "B" side. The A side of each of the figures is a cross-section taken along view A of FIG. 3. The B side figures are cross-sections taken along view B of FIG. 3. Thus, FIGS. 5A–16A are taken during a processing sequence along plane A of FIG. 3, whereas FIGS. 5B–16B are taken during similar processing sequence along plane B of FIG. 4. Turning now to FIGS. 5A and 5B, first interconnect level 102 is formed on semiconductor substrate 101. First interconnect level 102 is preferably formed during a physical vapor deposition process using an aluminum source. Substrate 101 provides physical support for interconnect level 102. Substrate 101 includes semiconductor processing performed prior to the formation of interconnect level 102 and can include polysilicon gate transistor structures, field oxide or trench isolation structures, or an underlying dielectric for isolating first interconnect 102 from active regions of substrate 101. In FIGS. 6A and 6B, first interconnect level 102 has been patterned. Patterning of first interconnect level 102 is accomplished with a photolithography step followed by an etch process. As seen in FIG. 6B, first interconnect 102 and semiconductor substrate 101 cooperatively define a topography. Turning now to FIGS. 7A and 7B, first dielectric layer 103 is formed upon the topography of FIGS. 6A and 6B and planarized to produce a substantially planar upper surface. Portions of dielectric 103 removed during planarization are represented in the drawings by the dashed lines. Planarization of first dielectric layer 103 can be accomplished in numerous ways including a chemical mechanical polish, a resist etchback process, or a combination thereof. First dielectric layer 103, in one embodiment, is comprised of an oxide formed in a chemical vapor deposition chamber using a TEOS source.

Figure 8A:
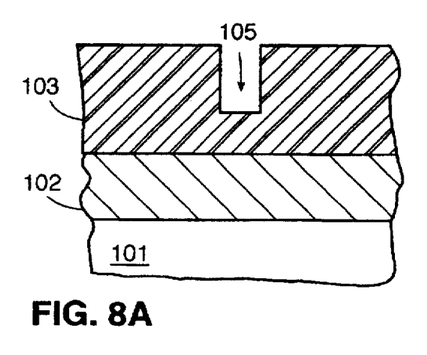
FIGS. 8A and 8B show a subsequent processing step in which a trench has been formed in the first dielectric layer.
Figure 8B:
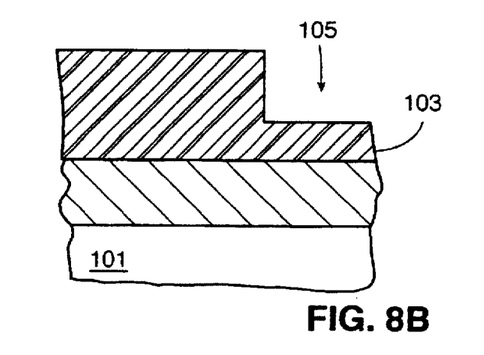
Figure 9A:
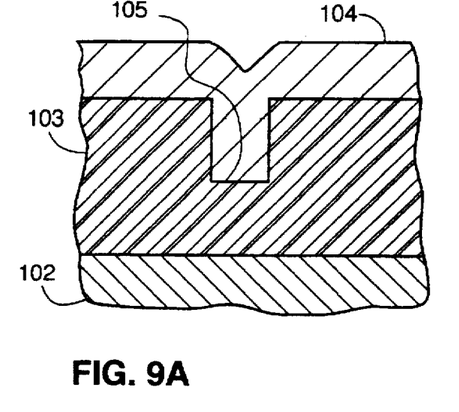
FIGS. 9A and 9B show a subsequent processing step in which the trench has been filled with a conductive material.
Figure 9B:
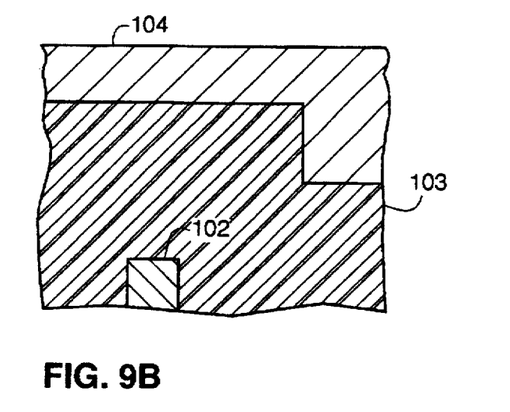

After formation and planarization of first dielectric 103, trench 105 is formed in first dielectric layer 103 as shown in FIGS. 8A and 8B. Trench 105 is formed with a photolithography step followed by a dry etch process that produces an anisotropic etch. Anisotropic etching of dielectric 103 can be accomplished with a plasma etch process using a fluorocarbon compound. Trench 105 extends downward from an upper surface of first dielectric 103 and extends partially but not completely through dielectric 103. After formation of trench 105, conductive material 104 is deposited to fill trench 105 as depicted in FIGS. 9A and 9B. In one embodiment, conductive material 104 comprises tungsten deposited in a chemical vapor deposition process. In this embodiment, an adhesion layer comprising titanium nitride (TiN) is deposited prior to the deposition of the tungsten to overcome the poor adhesion qualities of the tungsten film.

Figure 10A:
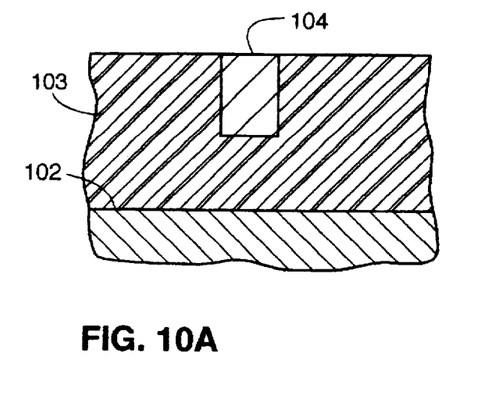
FIGS. 10A and 10B show a subsequent processing step in which the conductive material has been planarized back to the upper surface of the first dielectric layer.
Figure 10B:
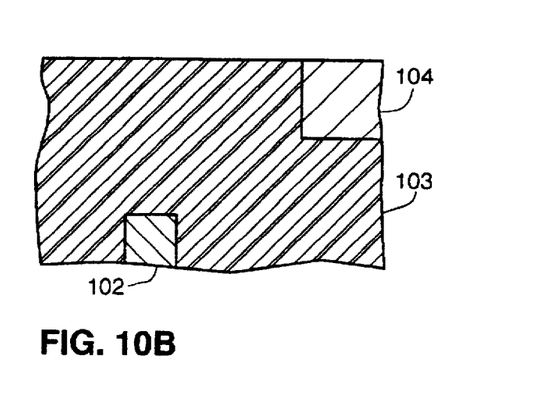

Turning now to FIGS. 10A and 10B, excess conductive material 104 is removed from regions exterior to trench 105 with a planarization process. Planarization of conductive material 104 is preferably accomplished with a chemical mechanical polish designed to terminate when an upper surface of conductive material 104 is substantially coplanar with an upper surface of first dielectric layer 103. FIGS. 10A and 10B show a cross section of the interconnect structure after planarization of conductive material 104.

Figure 11A:
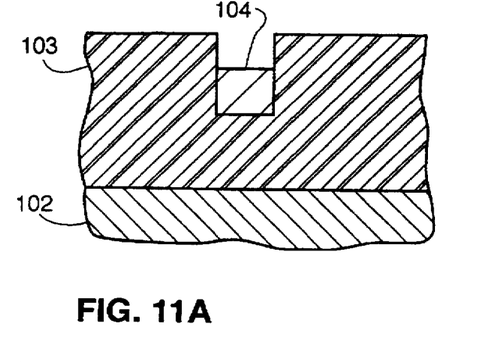
FIGS. 11A and 11B show subsequent processing step in which the conductive material has been partially etched.
Figure 11B:
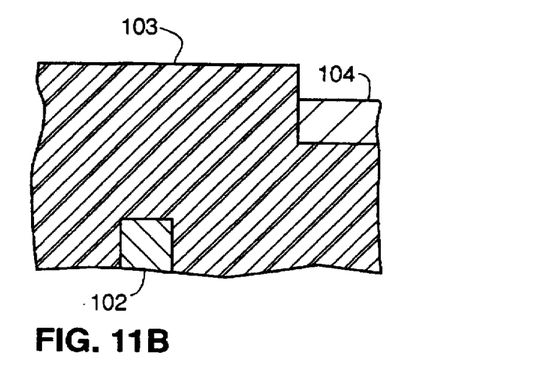
Figure 12A:
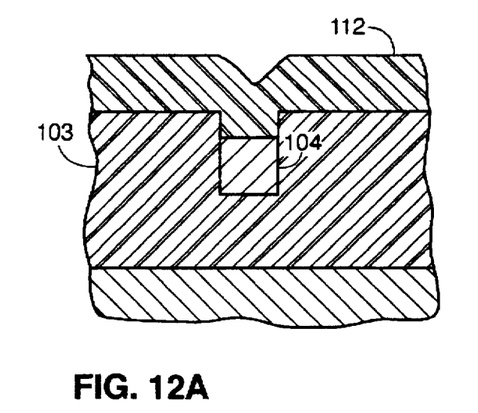
FIGS. 12A and 12A show a subsequent processing step in which a second dielectric layer has been formed to fill the trench.
Figure 12B:
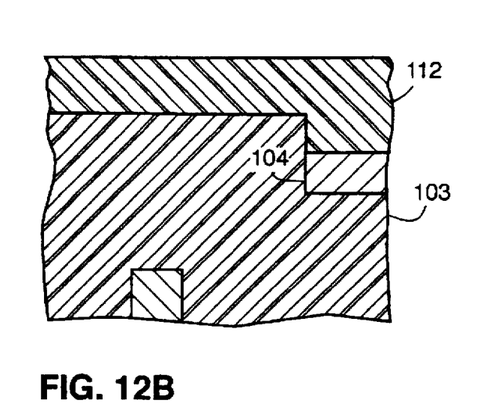
Figure 13A:
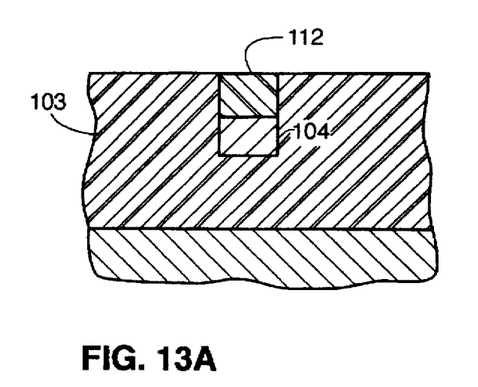
FIGS. 13A and 13B show a subsequent processing step in which the second dielectric layer has been planarized back to the upper surface of the first dielectric layer.
Figure 13B:
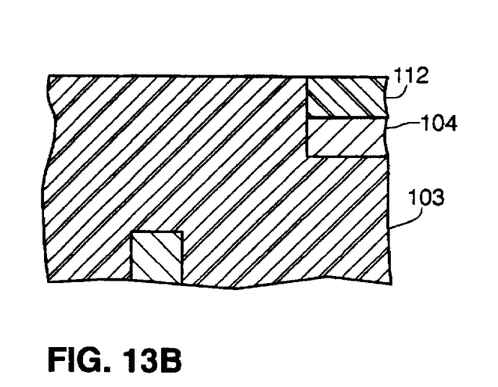

After the planarization of conductive material 104, portions of conductive material 104 proximal to the upper surface of dielectric 103 are etched with an etch process highly selective to conductive material 104. In an embodiment in which conductive material 104 is comprised of tungsten and first dielectric layer 103 is comprised of CVD oxide, an etch process selective to conductive material 104 utilizes a chlorine or fluorine plasma. FIGS. 11A and 11B show cross-sectional views of the interconnect structure after the etch of conductive material 104. As shown in the drawings, an upper surface of conductive material 104 is vertically displaced from an upper surface of first dielectric 103. The portion of conductive material 104 remaining after the etch and shown in FIGS. 11A and 11B forms local conductor 104. Second dielectric 112 is then deposited to fill the remaining portion of trench 105. FIGS. 12A and 12B show cross sections of the interconnect structure after deposition of dielectric 112. Like first dielectric layer 103, second dielectric 112 can be a CVD oxide. Second dielectric 112 can then be planarized as shown in FIGS. 13A and 13B to achieve a substantially planar upper surface.

Figure 14A:
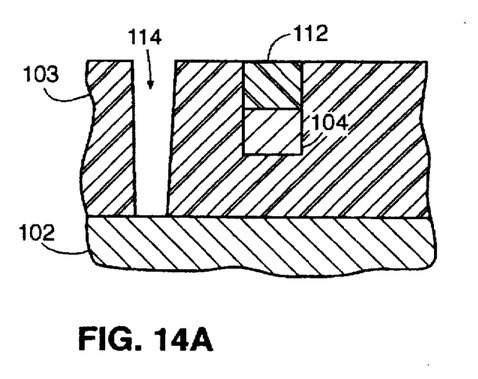
FIGS. 14A and 14B show a subsequent processing step in which contacts to the first interconnect level and to the conductive material have been formed in the first dielectric layer and second dielectric layer respectively.
Figure 14B:
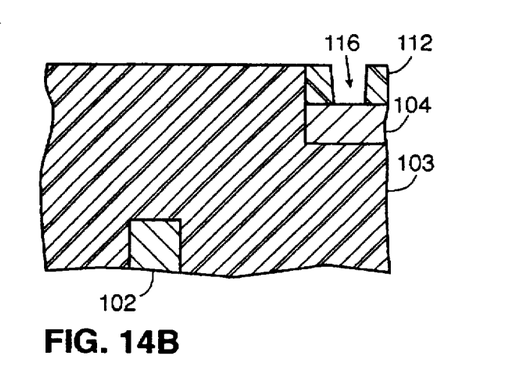

In the process steps shown in FIGS. 14A and 14B, contact tunnels 114 and 116 are etched into first dielectric layer 103 and second dielectric layer 112, respectively. Contact 114 extends from an upper surface of first dielectric layer 103 to first interconnect level 102. Contact 116 extends from an upper surface of second dielectric 112 to local conductor 104. In the embodiment shown, contact tunnel 114 and 116 are formed during the same etch process. The etch process used to form contact tunnels 114 and 116 must be highly selective to dielectric 103 with respect to the conductive material used for local conductor 104. In an embodiment wherein dielectric 103 comprises CVD oxide and local conductor 104 is comprised of tungsten, the etch process must be designed such that the oxide etch rate is much greater than (i.e., 10× or more) the tungsten etch rate. It is believed that the desirable selectivity can be achieved with a fluorocarbon-based plasma etch process.

Figure 15A:
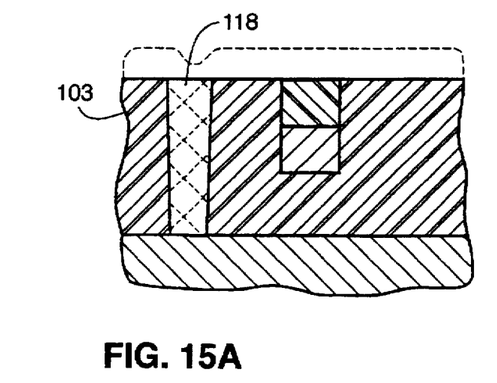
FIGS. 15A and 15B show a subsequent processing step in which the contact to the first interconnect level and the contact to the local interconnect have been filled with a conductive material such as tungsten and planarized.
Figure 15B:
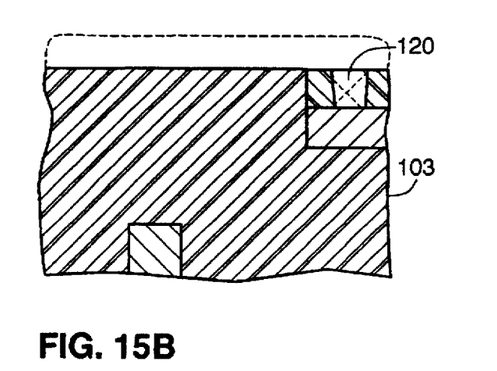
Figure 16A:
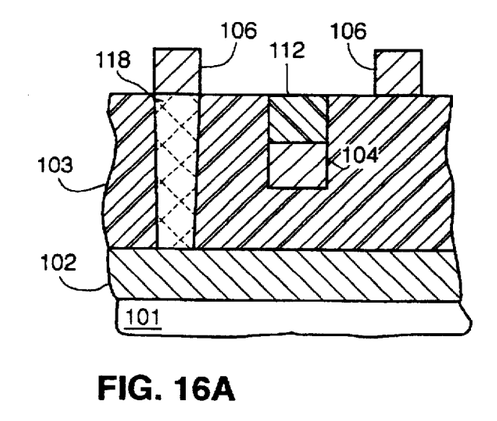
FIGS. 16A and 16B show a subsequent processing step in which a second level interconnect has been formed and patterned.
Figure 16B:
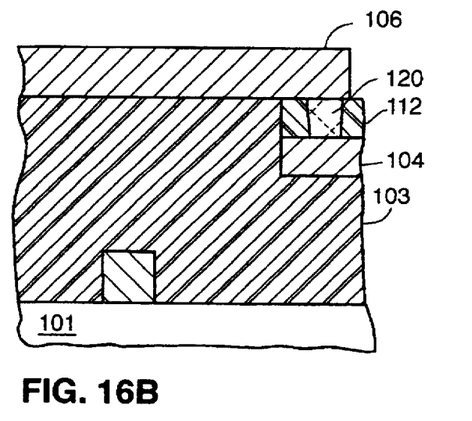

Turning now to FIGS. 15A and 15B, contact tunnels 114 and 116 are filled with a conductive material after which excess conductive material exterior to the contact tunnels is removed with a chemical mechanical polish or an alternative planarization process. In one exemplary embodiment of invention, a blanket deposition of tungsten is performed to fill the contact tunnels. Deposition of the blanket tungsten layer may be preceded by depositing a thin adhesion layer as discussed previously. Typical adhesion layers may be comprised of titanium, titanium tungsten, titanium nitride or a combination thereof. The excess conductive material removed during the subsequent planarization process is represented in FIGS. 15A and 15B by the dotted lines. Turning now to FIGS. 16A and 16B, the formation of second interconnect level 106 is depicted. Second interconnect level 106 is preferably comprised of aluminum formed in a physical vapor deposition process step using an aluminum target. Second interconnect level 106 is blanket deposited on an upper surface of first dielectric 103, second dielectric 112, and contacts 118 and 120. Second interconnect level 106 is then patterned using a photolithography step and etched preferably in a dry etch process with a chlorinated plasma.

The process sequence beginning with FIG. 5 and concluding with FIG. 16 can be repeated subsequent to FIG. 16, wherein second interconnect level 106 will serve as first interconnect level 102 and wherein first dielectric layer 103 can be deposited on second interconnect level 106. Accordingly, the process steps shown in FIGS. 5 through 16 are but three levels of possibly numerous levels of interconnect which can be formed. Further, the processing steps described above are illustrative of an exemplary interconnect structure 100 shown in FIG. 3. Although, it is understood that the arrangement of first interconnect 102, local interconnect 104, and second interconnect 106 can take on numerous forms, and contacts therebetween can be arranged in numerous ways. For example, there may be instances where, depending on a number of first and second level conductors, there may be fewer or more than the number of contacts shown in FIG. 3. The exemplary embodiment shown are therefore merely exemplary of a single form of numerous forms, all this would be obvious to a person skilled in the art having the benefit of this disclosure. Various modifications and changes may be made to each and every processing step as would be obvious to a person skilled in the art having the benefit of this disclosure. It is intended that following claims be interpreted to embrace all such modifications and changes and, accordingly, the specification and drawings are to be regarded in an illustrative rather than a restrictive sense.

What is claimed is:

1. A method of forming a recessed interconnect structure comprising:

forming a substantially coplanar set of first conductors upon a semiconductor substrate;

depositing a first dielectric layer on said first conductors;

forming a trench in said first dielectric layer;

depositing a conductive material in said trench;

planarizing said conductive material until an upper surface of said conductive material in said trench is substantially coplanar with an upper surface of said first dielectric;

etching said conductive material until said upper surface of said conductive material is displaced below the upper surface of said first dielectric; and forming a second dielectric layer on said conductive material and said first dielectric layer.

2. The method of claim 1, wherein depositing said first dielectric layer comprises depositing oxide in a chemical vapor deposition reactor chamber with a TEOS source.

3. The method of claim 1, wherein depositing said first dielectric layer comprises depositing oxide in a chemical vapor deposition reactor chamber with a silane source.

4. The method of claim 1, wherein said conductive material comprises tungsten.

5. The method of claim 1, wherein said conductive material comprises metal or metal silicide.

6. The method of claim 1, further comprising planarizing said second dielectric to produce a substantially planar upper surface.

7. The method of claim 6, wherein said upper surface of said second dielectric is substantially coplanar with an upper surface of said first dielectric.

8. The method of claim 1, further comprising forming a contact tunnel extending from the upper surface of said second dielectric to said conductive material.

9. The method of claim 1, further comprising forming a contact opening extending from said upper surface of said second dielectric to said etched conductive material.

10. The method of claim 1, further comprising forming a substantially coplanar set of second conductors on the upper surface of said first dielectric.

* * * * *